United States Patent
Pfaff et al.

(10) Patent No.: US 12,119,828 B1
(45) Date of Patent: Oct. 15, 2024

(54) CLOCK SYNTHESIZER WITH DUAL CONTROL

(71) Applicant: Synopsys, Inc., Sunnyvale, CA (US)

(72) Inventors: Dirk Pfaff, Ottawa (CA); Ralph Mason, Ottawa (CA); Robert Abbott, Ottawa (CA); Christopher Falkingham, East York (CA)

(73) Assignee: Synopsys, Inc., Sunnyvale, CA (US)

( * ) Notice: Subject to any disclaimer, the term of this patent is extended or adjusted under 35 U.S.C. 154(b) by 35 days.

(21) Appl. No.: 18/198,797

(22) Filed: May 17, 2023

(51) Int. Cl.
   *H03K 5/135* (2006.01)
   *H03K 5/00* (2006.01)
   *H03K 5/26* (2006.01)

(52) U.S. Cl.
   CPC ......... *H03K 5/135* (2013.01); *H03K 5/00006* (2013.01); *H03K 5/26* (2013.01)

(58) Field of Classification Search
   None
   See application file for complete search history.

(56) References Cited

U.S. PATENT DOCUMENTS

| | | | | |
|---|---|---|---|---|
| 11,664,765 B2 * | 5/2023 | Yamamoto | ............. | G05F 1/575 331/116 FE |
| 2004/0263224 A1 * | 12/2004 | Schrodinger | ........... | H03L 7/087 327/156 |

* cited by examiner

*Primary Examiner* — Cassandra F Cox
(74) *Attorney, Agent, or Firm* — Patterson + Sheridan, LLP (57) ABSTRACT

The present disclosure describes circuits (e.g., clock synthesizers) and methods for producing alternating signals. A clock synthesizer includes an oscillator, a voltage control circuit, and a frequency control circuit. The oscillator produces an output signal with a frequency. The voltage control circuit produces a control voltage for the oscillator based on the frequency of the output signal. The frequency control circuit produces a control signal for the oscillator based on (i) an input voltage to the frequency control circuit and (ii) the control voltage. The control signal causes the oscillator to adjust the frequency of the output signal such that the voltage control circuit adjusts the control voltage to be closer to the input voltage.

20 Claims, 9 Drawing Sheets

CLOCK SYNTHESIZER WITH DUAL CONTROL

TECHNICAL FIELD

The present disclosure relates to clock synthesizers. Specifically, the present disclosure relates to a clock synthesizer with dual control.

BACKGROUND

Clock signals control the timing in electronic circuits, especially in digital circuits. Clock synthesizer circuits may be used to produce the clock signals for these circuits. The clock synthesizer circuits may use oscillating signals (e.g., from crystal oscillators) to produce the clock signals.

SUMMARY

The present disclosure describes circuits (e.g., clock synthesizers) and methods for producing alternating signals. According to an embodiment, a clock synthesizer includes an oscillator, a voltage control circuit, and a frequency control circuit. The oscillator produces an output signal with a frequency. The voltage control circuit produces a control voltage for the oscillator based on the frequency of the output signal. The frequency control circuit produces a control signal for the oscillator based on (i) an input voltage to the frequency control circuit and (ii) the control voltage. The control signal causes the oscillator to adjust the frequency of the output signal such that the voltage control circuit adjusts the control voltage to be closer to the input voltage.

The oscillator may include a first set of voltage controlled capacitors and a second set of voltage controlled capacitors. A capacitance of the first set of voltage controlled capacitors may vary based on the control voltage. A capacitance of the second set of voltage controlled capacitors may vary based on the control signal.

The frequency control circuit may include a comparator that produces a comparator output based on the control voltage and the input voltage. The frequency control circuit may include a filter that produces the control signal based on the comparator output. The filter may include an integrator that integrates the comparator output and a scaling factor. The filter may include a modulator that produces an offset for an output of the integrator. The filter may include an encoder that converts the offset and the output of the integrator from binary to thermometer code to produce the control signal.

The input voltage may be half of a supply voltage to the voltage control circuit.

According to another embodiment, a method for producing an alternating signal includes producing, by an oscillator, an output signal with a frequency and producing, by a voltage control circuit, a control voltage for the oscillator based on the frequency of the output signal. The method also includes producing, by a frequency control circuit, a control signal for the oscillator based on (i) an input voltage to the frequency control circuit and (ii) the control voltage and adjusting, by the oscillator and based on the control signal, the frequency of the output signal. The method further includes adjusting, by the voltage control circuit, the control voltage to be closer to the input voltage after the oscillator adjusts the frequency of the output signal.

The oscillator may include a first set of voltage controlled capacitors and a second set of voltage controlled capacitors. A capacitance of the first set of voltage controlled capacitors may vary based on the control voltage. A capacitance of the second set of voltage controlled capacitors may vary based on the control signal.

The method may include producing, by a comparator of the frequency control circuit, a comparator output based on the control voltage and the input voltage. The frequency control circuit may include a filter that produces the control signal based on the comparator output. The method may include integrating, by an integrator of the filter, the comparator output and a scaling factor. The method may include producing, by a modulator of the filter, an offset for an output of the integrator. The filter may include an encoder that converts the offset and the output of the integrator from binary to thermometer code to produce the control signal.

According to another embodiment, a circuit for producing an alternating signal includes a voltage control circuit, a frequency control circuit, and an oscillator. The voltage control circuit produces a control voltage. The frequency control circuit produces a control signal. The oscillator produces an output signal with a frequency based on the control voltage and the control signal. The frequency control circuit also adjusts the control signal such that the voltage control circuit adjusts the control voltage to be closer to an input voltage to the frequency control circuit.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a clock synthesizer with dual control. Clock synthesizers are used to generate alternating signals (e.g., clock signals) for other circuits. These signals may alternate with a particular frequency. Imperfections in the clock synthesizers or external conditions, however, may affect the clock synthesizer's ability to maintain this frequency. As a result, the frequency of the alternating signal may vary slightly during operation, a phenomenon referred to as jitter. Jitter may negatively impact the operating speed of circuits, and so, jitter may be reduced to support higher operating speeds.

Additionally, over time, clock synthesizers and circuits are designed to consume less power. But the reduction in power consumption may exacerbate the jitter in the alternating signals. Thus, higher operating speeds and reduced power consumption appear to conflict with each other when managing jitter.

The present disclosure describes a circuit (e.g., a clock synthesizer circuit) that uses two types of control to produce an alternating signal (e.g. an output clock signal). First, the circuit uses a voltage control circuit to control an oscillator that produces the alternating signal. Due to the low gains in the oscillator (e.g., to reduce power consumption), the oscillator may unlock and cause the alternating signal to have a frequency different from a desired frequency. The circuit uses a frequency control circuit to control the oscillator so that the frequency of the alternating signal is brought back closer to the desired frequency. Additionally, the control voltage produced by the voltage control circuit is brought back towards a desired voltage.

In certain embodiments, the circuit provides several technical advantages. For example, the circuit may produce an alternating signal with a desired frequency even though the oscillator has low tuning sensitivity. As another example, the circuit may reduce jitter relative to existing clock synthesizers that use oscillators with low tuning sensitivities. As another example, the circuit may reduce power consumption relative to existing clock synthesizers.

Figure 1:
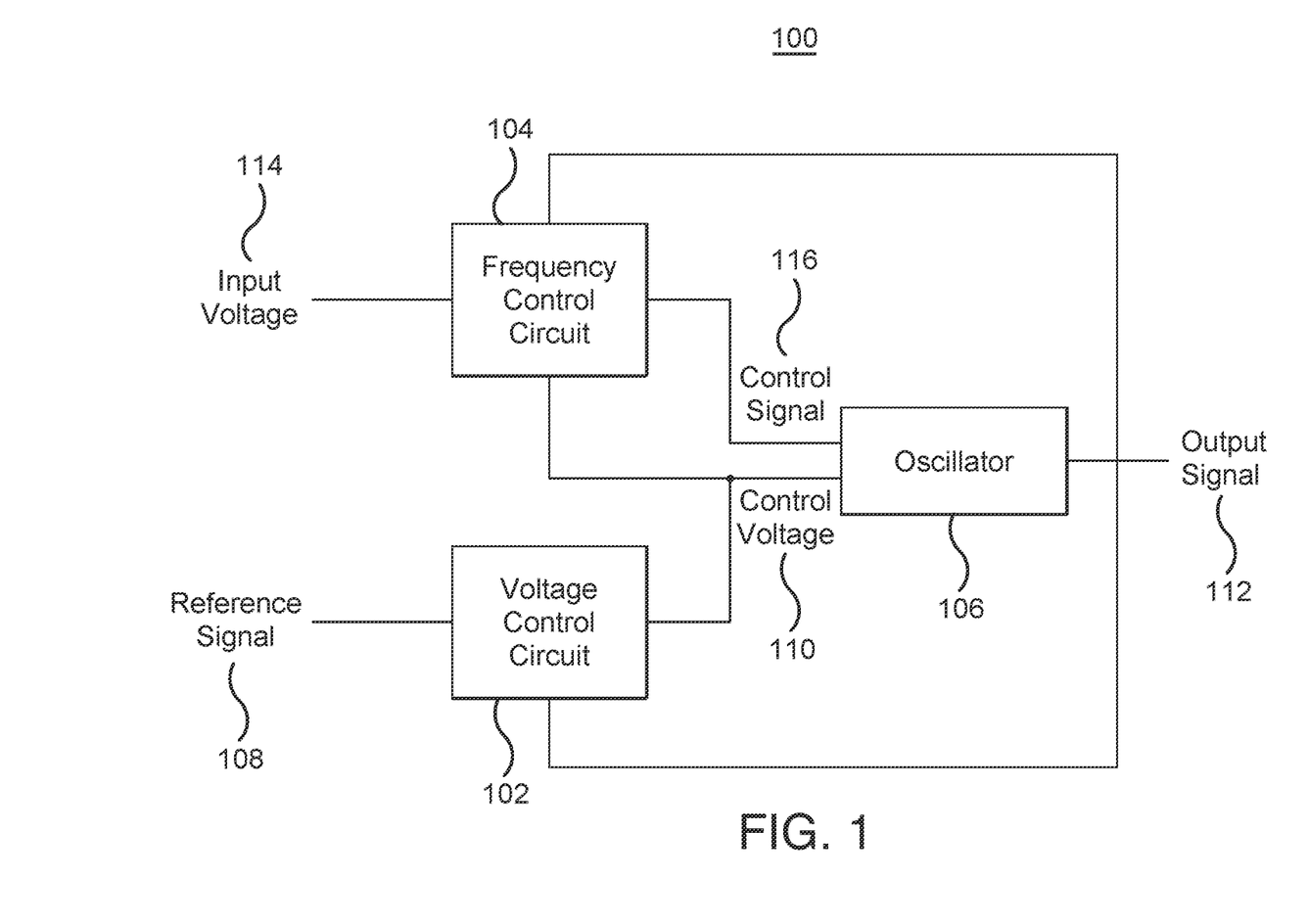
FIG. 1 illustrates an example system for generating a signal (e.g., a clock signal).

FIG. 1 illustrates an example system 100. Generally, the system 100 may be a circuit (e.g., a clock synthesizer circuit) that produces an alternating signal (e.g., a clock signal). As seen in FIG. 1, the system 100 includes a voltage control circuit 102, a frequency control circuit 104, and an oscillator 106. The voltage control circuit 102 and the frequency control circuit 104 may control the oscillator 106 to produce the alternating signal. For example, the voltage control circuit 102 and the frequency control circuit 104 may cause the oscillator 106 to change the frequency of the alternating signal.

The voltage control circuit 102 may receive a reference signal 108. The reference signal 108 may be an alternating signal produced by a signal source (e.g., a crystal oscillator). The reference signal 108 may have a reference frequency. The voltage control circuit 102 may use the reference frequency to analyze the frequency output of the oscillator 106.

The voltage control circuit 102 may use the reference signal 108 and its reference frequency to produce a control voltage 110. The voltage control circuit 102 may direct the control voltage 110 to the oscillator 106. The oscillator 106 may produce an output signal 112 using the control voltage 110. Specifically, the control voltage 110 may control the frequency of the output signal 112. The voltage control circuit 102 and the oscillator 106 may implement a phase locked loop. During steady state operation, the oscillator 106 may be locked, which results in the oscillator 106 producing the output signal 112 with a consistent frequency (also referred to as the lock frequency).

In some instances, changes or variations in operating conditions may retune the oscillator 106, which causes the frequency of the output signal 112 to drift. For example, changes in a supply voltage or temperature may cause the frequency of the output signal 112 to change or drift. The voltage control circuit 102 may detect the change in frequency of the output signal 112 and change the control voltage 110 to bring the frequency of the output signal 112 back towards the lock frequency.

Specifically, the output signal 112 may be received by the voltage control circuit 102 in a feedback loop. The voltage control circuit 102 may determine if the output signal 112 has the lock frequency by comparing the frequency of the output signal 112 with the frequency of the reference signal 108. In some embodiments, the voltage control circuit 102 may include a frequency divider circuit that divides or reduces the frequency of the output signal 112 before comparing the frequency of the output signal 112 with the frequency of the reference signal 108. The voltage control circuit 102 may then adjust the control voltage 110 to adjust the frequency of the output signal 112 (e.g., to keep the frequency of the output signal 112 at the lock frequency).

As operating speeds have increased, it has become important for the output signal 112 to have low jitter. An oscillator 106 with reduced or lower tuning gain may produce an output signal 112 with reduced jitter. Due to the reduced or lower tuning gain, however, the oscillator 106 may be more susceptible to unlocking. For example, changes in supply voltage or temperature may cause the frequency of the output signal 112 to drift away from the lock frequency. The voltage control circuit 102 may adjust the control voltage 110 to offset or counter the frequency drift. The change in the control voltage 110, however, may cause the control voltage 110 to fall outside the voltage range supported by the oscillator 106. As a result, the voltage control circuit 102 may be unable to offset or counter the frequency drift, and the oscillator 106 may produce the output signal 112 with a frequency that deviates from the lock frequency.

The frequency control circuit 104 may assist the oscillator 106 when the oscillator 106 has unlocked. The frequency control circuit 104 receives an input voltage 114. The input voltage 114 may be set at any suitable voltage. For example, the input voltage 114 may be set at half the value of a supply voltage to the voltage control circuit 102 or the oscillator 106. As a result, the input voltage 114 may fall within the voltage range supported by the oscillator 106. In some embodiments, the input voltage 114 is produced by a digital-to-analog converter and directed to the frequency control circuit 104. The frequency control circuit 104 may also receive the control voltage 110 from the voltage control circuit 102. The frequency control circuit 104 may produce a control signal 116 by comparing the input voltage 114 with the control voltage 110. The frequency control circuit 104 then directs the control signal 116 to the oscillator 106.

The control signal 116 may retune the oscillator 106 to bring the oscillator 106 back to a locked state. For example, if changes in operating conditions caused the oscillator 106 to produce an output signal 112 with a frequency that is higher than the lock frequency, the voltage control circuit 102 may decrease the control voltage 110 to try to reduce the frequency of the output signal 112. The reduction in the control voltage 110 may cause the control voltage 110 to fall outside the voltage range supported by the oscillator 106, and the oscillator 106 may unlock. As a result, the frequency of the output signal 112 remains above the lock frequency. The control signal 116 may retune the oscillator 106 to reduce the frequency of the output signal 112. In some instances, the control signal 116 may cause the oscillator 106 to reduce the frequency of the output signal 112 past the lock frequency. The voltage control circuit 102 may detect that the frequency of the output signal 112 has fallen below the lock frequency. In response, the voltage control circuit 102 may increase the control voltage 110 to increase the frequency of the output signal 112, which brings the control voltage 110 back towards the input voltage 114 of the frequency control circuit 104.

The frequency control circuit 104 may detect the change in the control voltage 110. The frequency control circuit 104 may continue changing the control signal 116 to retune the oscillator 106 and to reduce the frequency of the output signal 112 until the control voltage 110 matches, or substantially equals, the input voltage 114. Stated differently, the frequency control circuit 104 adjusts the control signal 116 so that the voltage control circuit 102 adjusts the control voltage 110 to be closer to the input voltage 114. When the control voltage 110 is at the input voltage 114, the control voltage 110 may be in the voltage range supported by the oscillator 106, and the oscillator 106 may produce the output signal 112 with the lock frequency. As a result, the frequency control circuit 104 allows an oscillator 106 with reduced or lower tuning gain to be used, which may reduce jitter in the output signal 112.

Figure 2:
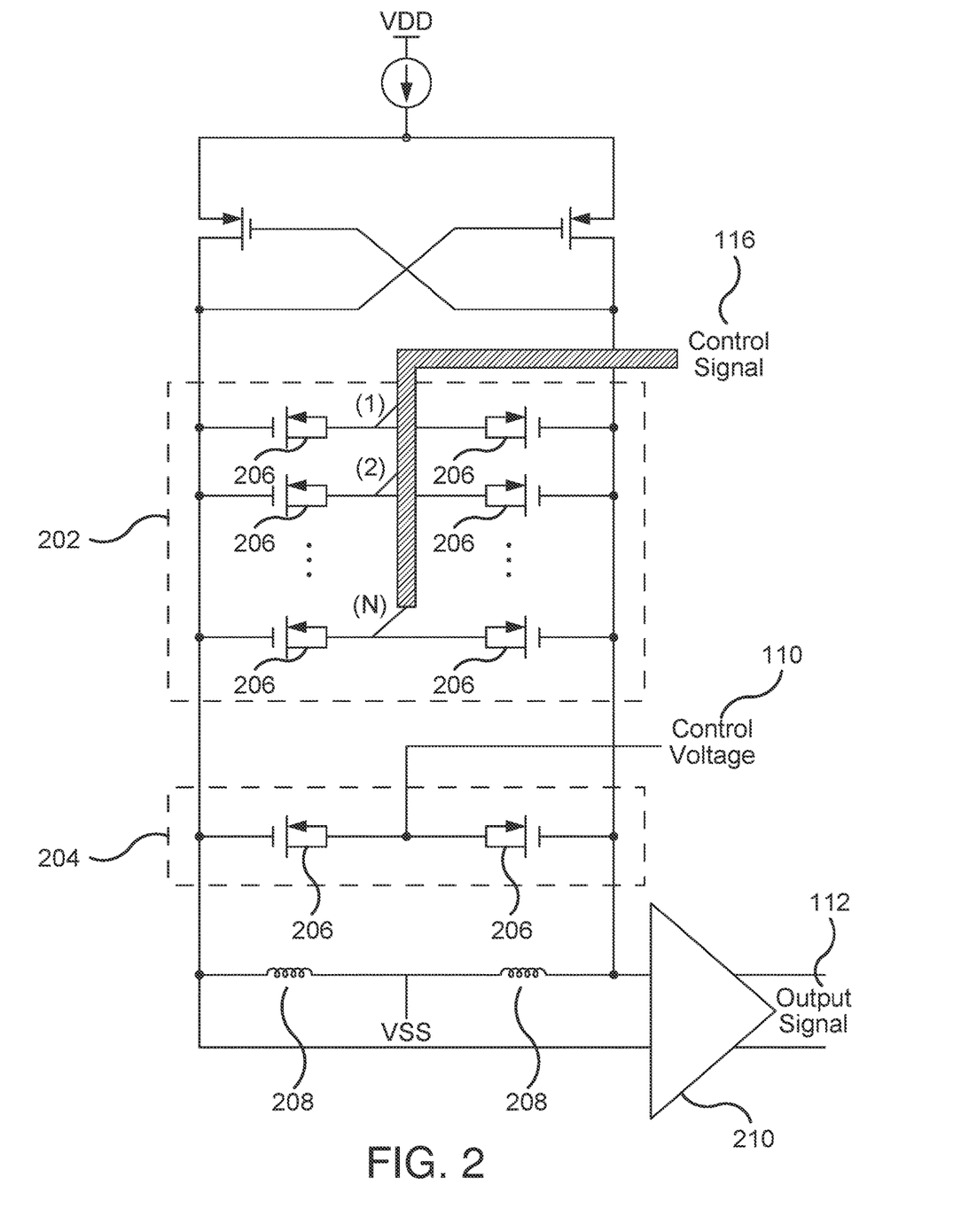
FIG. 2 illustrates an example oscillator of the system of FIG. 1.

FIG. 2 illustrates an example oscillator 106 of the system 100 of FIG. 1. As seen in FIG. 2, the oscillator 106 includes two sets 202 and 204 of voltage controlled capacitors 206. The set 202 of voltage controlled capacitors 206 are controlled by the control signal 116 from the frequency control circuit 104. The set 204 of voltage controlled capacitors 206 is controlled by the control voltage 110 from the voltage control circuit 102. The sets 202 and 204 of voltage controlled capacitors 206 may operate together to produce the output signal 112. The voltage controlled capacitors 206 may be implemented using junction diodes or metal-oxide-semiconductor (MOS) capacitors.

The set 202 of voltage controlled capacitors 206 may be controlled by bits in the control signal 116 from the frequency control circuit 104. For example, each bit in the control signal 116 may be directed to a pair of voltage controlled capacitors 206 in the set 202. As a result, if there are N bits in the control signal 116, then there may be N pairs of voltage controlled capacitors 206 in the set 202. Each of the bits in the control signal 116 may control or vary the capacitance of a respective pair of voltage controlled capacitors 206 in the set 202. Thus, by changing the control signal 116, the overall capacitance of the set 202 may be changed or varied.

The control voltage 110 may control or vary the capacitance of a pair of voltage controlled capacitors 206 in the set 204. Thus, changing the control voltage 110 may cause the overall capacitance of the set 204 to change.

The oscillator 106 may use a supply voltage (VDD) to drive an electric current through the oscillator 106. The sets 202 and 204 of voltage controlled capacitors 206 may use the current to produce an alternating signal with a particular frequency across differential inductors 208. An amplifier 210 may shape the alternating signal to produce the output signal 112. For example, the amplifier 210 may shape the alternating signal into a square wave that serves as a clock signal.

As discussed previously, adjusting the control voltage 110 may adjust the capacitance of the set 204, which may change the frequency of the output signal 112. Additionally, adjusting the control signal 116 may change the capacitance of the set 202, which may retune the oscillator 106 and change the frequency of the output signal 112.

Figure 3:
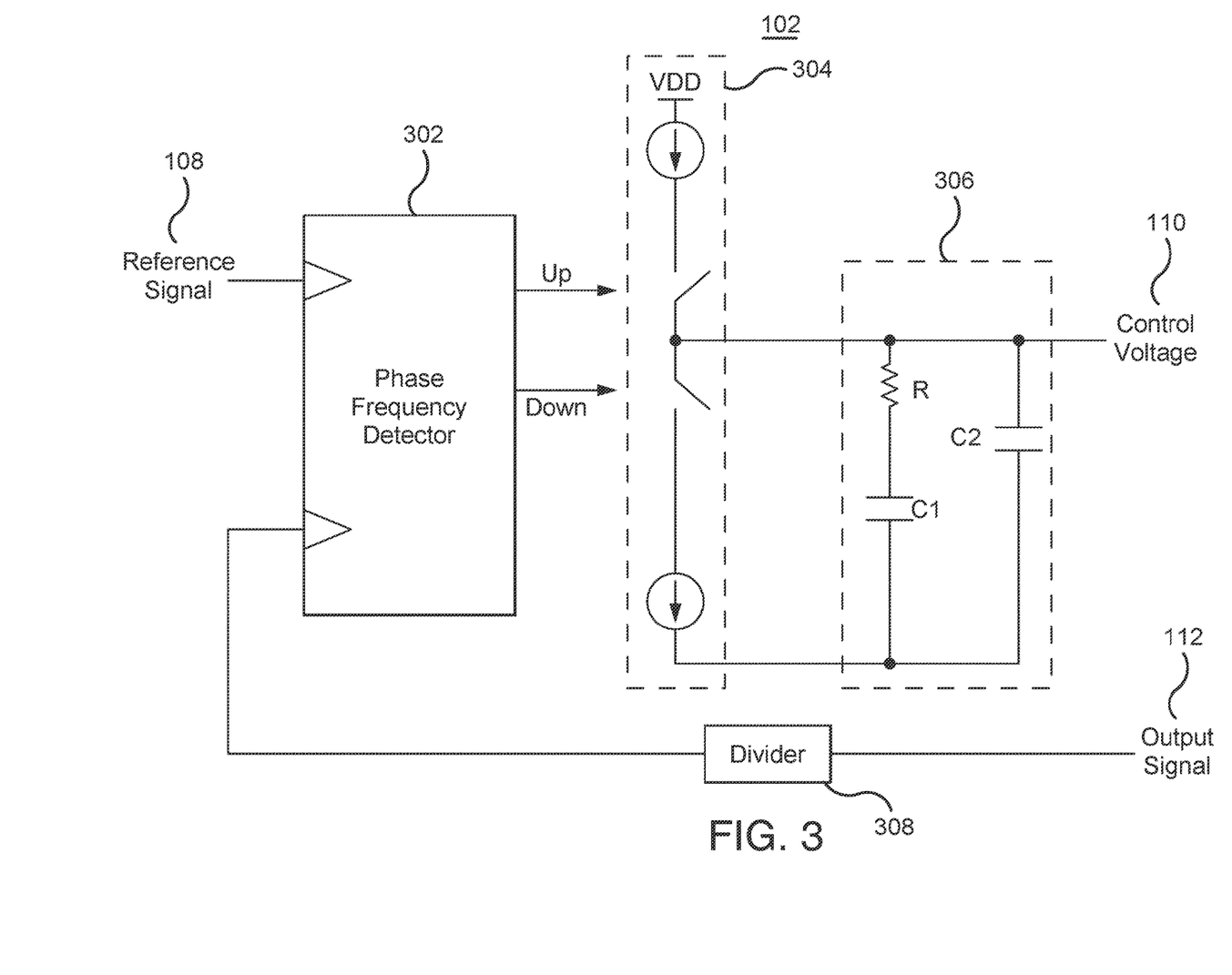
FIG. 3 illustrates an example voltage control circuit of the system of FIG. 1.

FIG. 3 illustrates an example voltage control circuit 102 of the system 100 of FIG. 1. Generally, the voltage control circuit 102 produces the control voltage 110 that is directed to the oscillator 106. As seen in FIG. 3, the voltage control circuit 102 includes a phase frequency detector 302, a charge pump 304, a loop filter 306, and a divider 308.

The phase frequency detector 302 receives the reference signal 108 and the output signal 112. The output signal 112 received by the phase frequency detector 302 may have had its frequency scaled or divided by the divider 308. The phase frequency detector 302 compares the frequency of the received output signal 112 with the frequency of the reference signal 108. Based on this comparison, the phase frequency detector 302 may determine whether the frequency of the output signal 112 should be adjusted (e.g., if the frequency of the output signal 112 is too high or too low). The phase frequency detector 302 may produce signals (e.g., UP and DOWN signals) that control switches in the charge pump 304. By closing and opening these switches using the signals, the charge pump 304 may increase or decrease the control voltage 110 output by the voltage control circuit 102 (e.g., to increase or decrease the frequency of the output signal 112, respectively). As discussed previously, increasing or decreasing the control voltage 110 may adjust the frequency of the output signal 112 produced by the oscillator 106.

The charge pump 304 may be powered by the supply voltage (VDD). The charge pump 304 may also include switches that open or close depending on signals from the phase frequency detector 302. By opening and closing the switches, the charge pump 304 may adjust the control voltage 110.

The loop filter 306 may filter the signal from the charge pump 304 to produce the control voltage 110. As seen in FIG. 3, the loop filter 306 includes a resistor R and a capacitor C1 connected in series. The resistor R and the capacitor C1 may be connected in parallel with another capacitor C2. In certain embodiments, the loop filter 306 may stabilize the control voltage 110 or limit the ripple in the control voltage 110.

Figure 4:
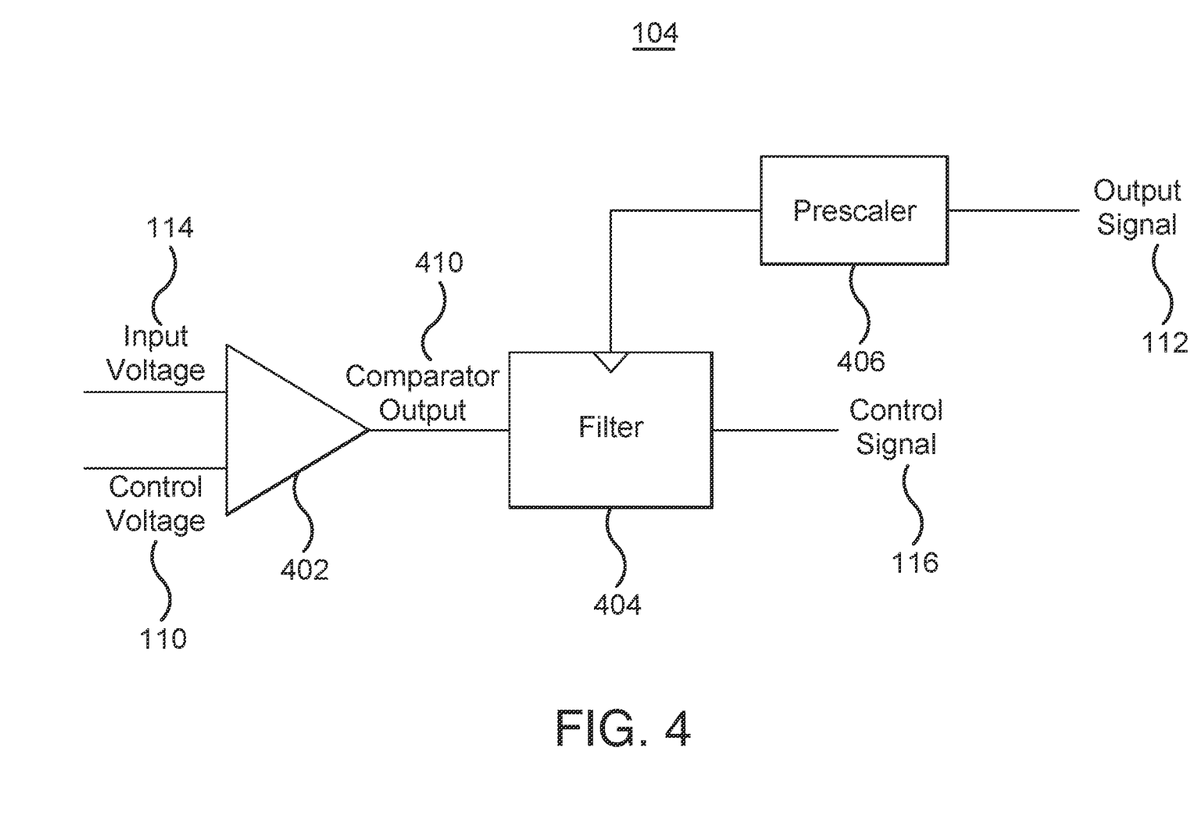
FIG. 4 illustrates an example frequency control circuit of the system of FIG. 1.

FIG. 4 illustrates an example frequency control circuit 104 of the system 100 of FIG. 1. Generally, the frequency control circuit 104 uses the input voltage 114 and the control voltage 110 from the voltage control circuit 102 to produce the control signal 116 for the oscillator 106. As seen in FIG. 4, the frequency control circuit 104 includes a comparator 402, a filter 404, and a frequency prescaler 406.

The comparator 402 compares the input voltage 114 and the control voltage 110 to produce a comparator output 410. Generally, the comparator output 410 indicates whether the control voltage 110 is greater than or less than the input voltage 114. For example, if the control voltage 110 is substantially equal to the input voltage 114, the comparator output 410 may be a positive polarity (e.g., a positive voltage signal such as the supply voltage (VDD). If the control voltage 110 is less than the input voltage 114, then the comparator output 410 may be a negative polarity (e.g., a zero voltage signal).

As discussed previously, the input voltage 114 may be set at a voltage within the voltage range supported by the oscillator 106. For example, the input voltage 114 may be set at half the supply voltage (e.g., VDD) to the voltage control circuit 102 and the oscillator 106. Generally, the frequency control circuit 104 produces the control signal 116, which retunes the oscillator 106 and adjusts the frequency of the output signal 112 such that the voltage control circuit 102 adjusts the control voltage 110 to be closer to the input voltage 114. By bringing the control voltage 110 closer to the input voltage 114, the frequency of the output signal 112 from the oscillator 106 may be closer to the lock frequency. In some embodiments, the frequency control circuit 104 may continue to adjust the control signal 116 until the voltage control circuit 102 produces the control voltage 110 that is substantially equal to the input voltage 114. As a result, the frequency control circuit 104 causes the oscillator 106 to produce the output signal 112 with the lock frequency while the voltage control circuit 102 produces the control voltage 110 that is within the voltage range supported by the oscillator 106.

The comparator 402 directs the comparator output 410 to the filter 404. The filter 404 may be a digital loop filter that uses the comparator output 410 to produce the control signal 116. For example, the filter 404 may gradually adjust the control signal 116 over time based on the comparator output 410 to adjust the frequency of the output signal 112 produced by the oscillator 106. Specifically, adjusting the control signal 116 may retune the oscillator 106 and change the frequency of the output signal 112.

The frequency prescaler 406 may divide or scale the frequency of the output signal 112. Stated differently, the prescaler 406 may produce the output signal 112 with a scaled or divided frequency. The output signal 112 is then directed to the filter 404. The filter 404 uses the output signal 112 with the scaled frequency as the clock signal for the filter 404.

Figure 5:
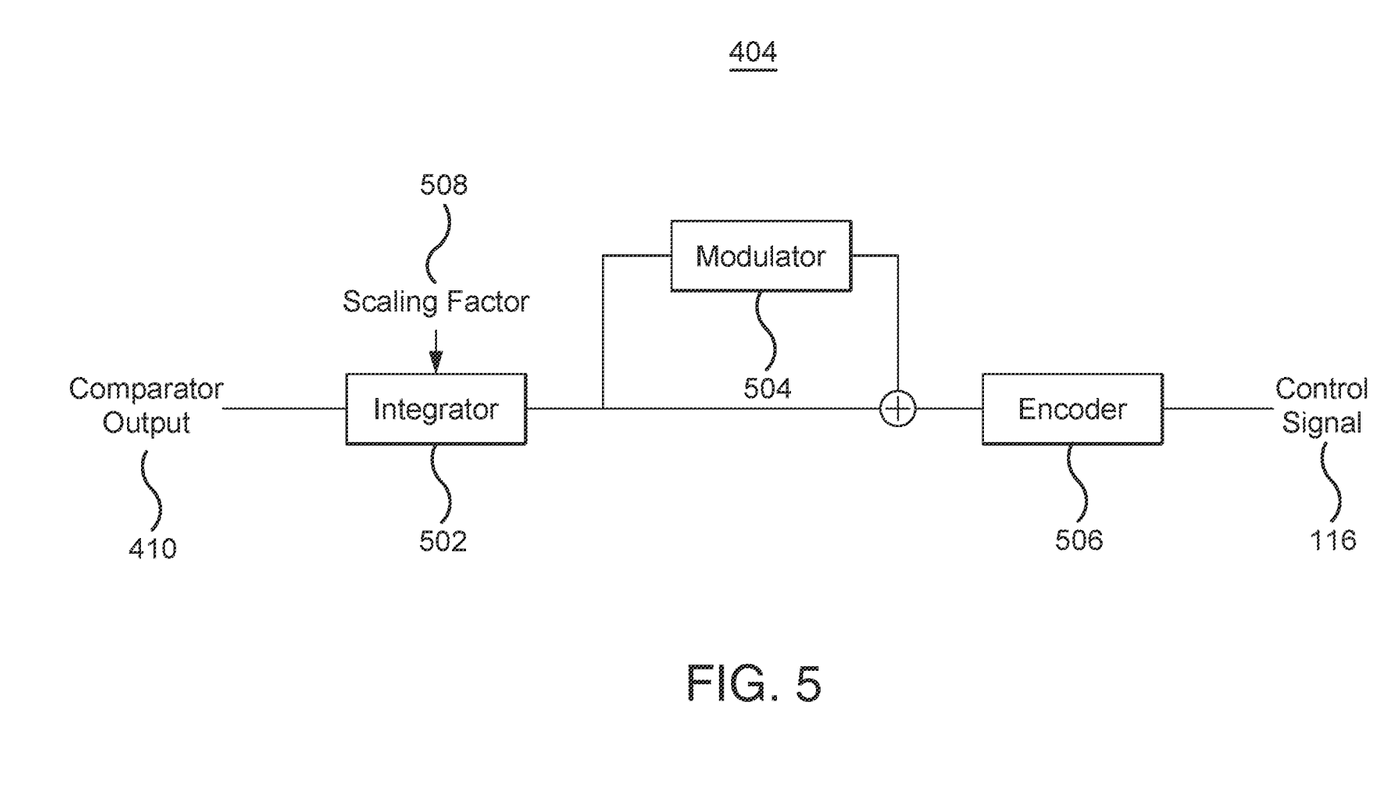
FIG. 5 illustrates an example filter of the frequency control circuit of FIG. 5.

FIG. 5 illustrates an example filter 404 of the frequency control circuit 104 of FIG. 4. As seen in FIG. 5, the filter 404 includes an integrator 502, a modulator 504, and an encoder 506. Generally, the integrator 502, modulator 504, and encoder 506 operate together to produce the control signal 116.

The integrator 502 integrates the comparator output 410 over a period of time. In some embodiments, the comparator output 410 is scaled by a scaling factor 508 prior to being integrated by the integrator 502. As a result, the integrator 502 integrates the comparator output 410 and the scaling factor 508 over the period of time. The integrator 502 may produce a bit sequence representing the result of integrating the comparator output 410. In some embodiments, the integrator 502 may supplement the output with additional bits that are later modified by the modulator 504. For example, the integrator 502 may use M bits to represent the result of the integration, and the integrator 502 may supplement the result by increasing the number of bits in the result by B bits.

The output of the integrator 502 is directed to the modulator 504 and the encoder 506. For example, some of the bits (e.g., B bits) of the output of the integrator 502 may be directed to the modulator 504 while the remaining bits (e.g., M bits) are directed to the encoder 506. The modulator 504 may change the B bits into a pseudo-random value that serves as an offset for the output of the integrator 502 before reaching the encoder 506. In this manner, the modulator 504 may increase the resolution of the frequency control circuit 104. Specifically, if the modulator 504 receives B bits from the output of the integrator 502, then the modulator 504 may increase the resolution of the frequency control circuit 104 by a factor of $2^B$.

The encoder 506 converts the binary output of the integrator 502 (and the offset from the modulator 504) into the control signal 116. In certain embodiments, the encoder 506 may perform thermometer encoding. The encoder 506 may convert the binary output into a binary sequence of ones followed by zeros, or vice versa. The number of ones in the sequence or the number of zeroes in the sequence is controlled by the value of the binary output from the integrator 502 and the modulator 504. For example, the higher the value of the binary output, the more number of ones in the sequence and the fewer the number of zeros. The encoder 506 may direct the control signal 116 to the oscillator 106. As discussed previously, each bit of the control signal 116 may then control a pair of voltage controlled capacitors 206 in the oscillator 106 to retune the oscillator 106.

Figure 6:
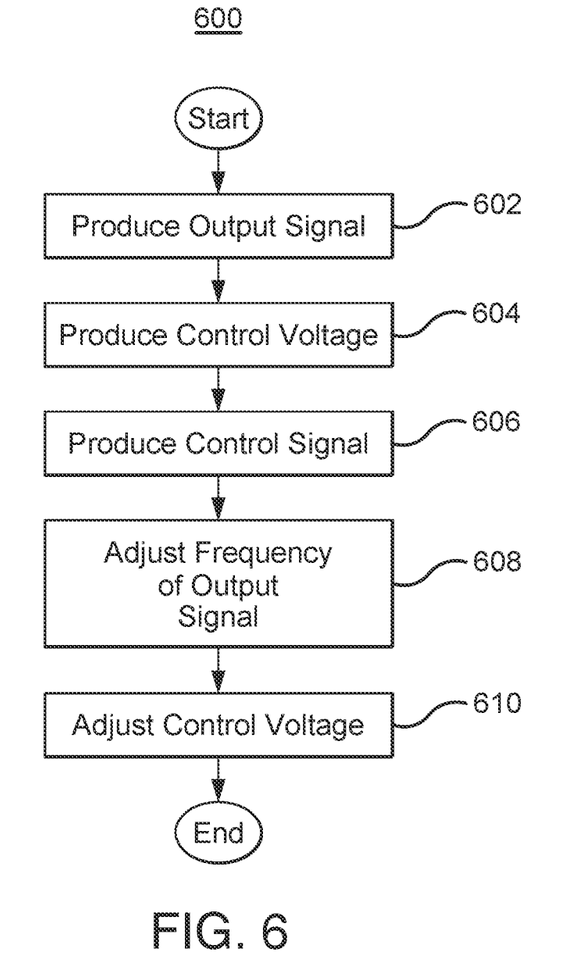
FIG. 6 is a flowchart of an example method for generating a signal (e.g., a clock signal) performed in the system of FIG. 1.

FIG. 6 is a flowchart of an example method 600 performed in the system 100 of FIG. 1. In particular embodiments, the components of the system 100 perform the method 600. By performing the method 600, the system 100 may use an oscillator 106 with reduced or lower tuning gain, which reduces jitter in the output signal 112.

At 602, the oscillator 106 produces the output signal 112 (e.g., with a desired lock frequency). Changes in operating conditions (e.g., changes in supply voltage or temperature) may cause the frequency of the output signal 112 to drift away from the desired lock frequency.

At 604, the voltage control circuit 102 produces the control voltage 110. The voltage control circuit 102 may direct the control voltage 110 to the oscillator 106. The control voltage 110 may control the frequency of the output signal 112 produced by the oscillator 106. The output signal 112 may be directed back to the voltage control circuit 102 in a feedback loop. When the frequency of the output signal 112 drifts, the voltage control circuit 102 may adjust the control voltage to try to bring the frequency of the output signal 112 back to the lock frequency.

In some instances, an oscillator 106 with reduced or lower tuning gain may be selected for the system 100 to reduce jitter in the output signal 112. The reduced or lower tuning gain, however, may cause the oscillator 106 to unlock when the voltage control circuit 102 adjusts the control voltage 110. For example, the adjustment to the control voltage 110 may cause the control voltage 110 to fall outside a voltage range supported by the oscillator 106. As a result, the voltage control circuit 102 may not bring the frequency of the output signal 112 back to the lock frequency.

At 606, the frequency control circuit 104 produces the control signal 116. The frequency control circuit 104 may direct the control signal 116 to the oscillator 106. The control signal 116 retunes the oscillator 106, which may cause the oscillator 106 to change the frequency of the output signal 112. For example, when the oscillator 106 is unlocked and the frequency of the output signal 112 drifts above the lock frequency, the control signal 116 may retune the oscillator 106 to reduce the frequency of the output signal 112.

The frequency control circuit 104 may produce the control signal 116 using the control voltage 110 from the voltage control circuit 102 and the input voltage 114. In some embodiments, the input voltage 114 may be set at half the supply voltage of the voltage control circuit 102 and the oscillator 106. As a result, the input voltage 114 may be set within the voltage range supported by the oscillator 106. The frequency control circuit 104 may compare the control voltage 110 to the input voltage 114 to produce the control signal 116. Specifically, the frequency control circuit 104 may produce the control signal 116 that causes the oscillator 106 to change the frequency of the output signal 112 such that the voltage control circuit 102 brings the control voltage 110 closer to the input voltage 114.

Using the previous example, if the frequency of the output signal 112 drifts above the lock frequency, the voltage control circuit 102 may adjust the control voltage 110 to try to offset or counter the drift. For example, the voltage control circuit 102 may reduce the control voltage 110 to try to reduce the frequency of the output signal 112. The frequency control circuit 104 may detect the change in the control voltage 110 and produce the control signal 116 that re-tunes the oscillator 106 to reduce the frequency of the output signal 112.

At 608, the oscillator 106 adjusts the frequency of the output signal 112 based on the control signal 116 from the frequency control circuit. Using the previous example, the control signal 116 may cause the oscillator 106 to reduce the frequency of the output signal 112, which counters the drift in frequency of the output signal 112. The frequency control circuit 104 may produce the control signal 116 that causes the oscillator 106 to more than offset or counter the change in frequency of the output signal 112. For example, the control signal 116 may cause the oscillator 106 to reduce the frequency of the output signal 112 below the lock frequency.

At 610, the voltage control circuit 102 may detect the change in frequency in the output signal 112 caused by the control signal 116. The voltage control circuit 102 may then change the control voltage 110 to counter or offset the change in frequency of the output signal 112 caused by the control signal 116. Using the previous example, if the control signal 116 causes the frequency of the output signal 112 to drop below the lock frequency, then the voltage control circuit 102 may adjust the control voltage 110 to increase the frequency of the output signal 112. For example, the voltage control circuit 102 may increase the control voltage to increase the frequency of the output signal 112. As a result, the voltage control circuit 102 may bring the control voltage 110 closer to the input voltage 114.

The frequency control circuit 104 may continue adjusting the control signal 116 to reduce the frequency of the output signal 112 so that the voltage control circuit 102 continues adjusting the control voltage 110 closer to the input voltage 114. The frequency control circuit 104 may stop adjusting the control signal 116 that reduces the frequency of the output signal 112 when the control voltage 110 matches the input voltage 114. In this manner, the frequency control circuit 104 in conjunction with the voltage control circuit 102 causes the frequency of the output signal 112 to be the lock frequency while maintaining the control voltage 110 in the voltage range supported by the oscillator 106. Thus, the frequency control circuit 104 allows an oscillator 106 with reduced or lower tuning gain to be used and helps keep the oscillator 106 locked.

Figure 7A:
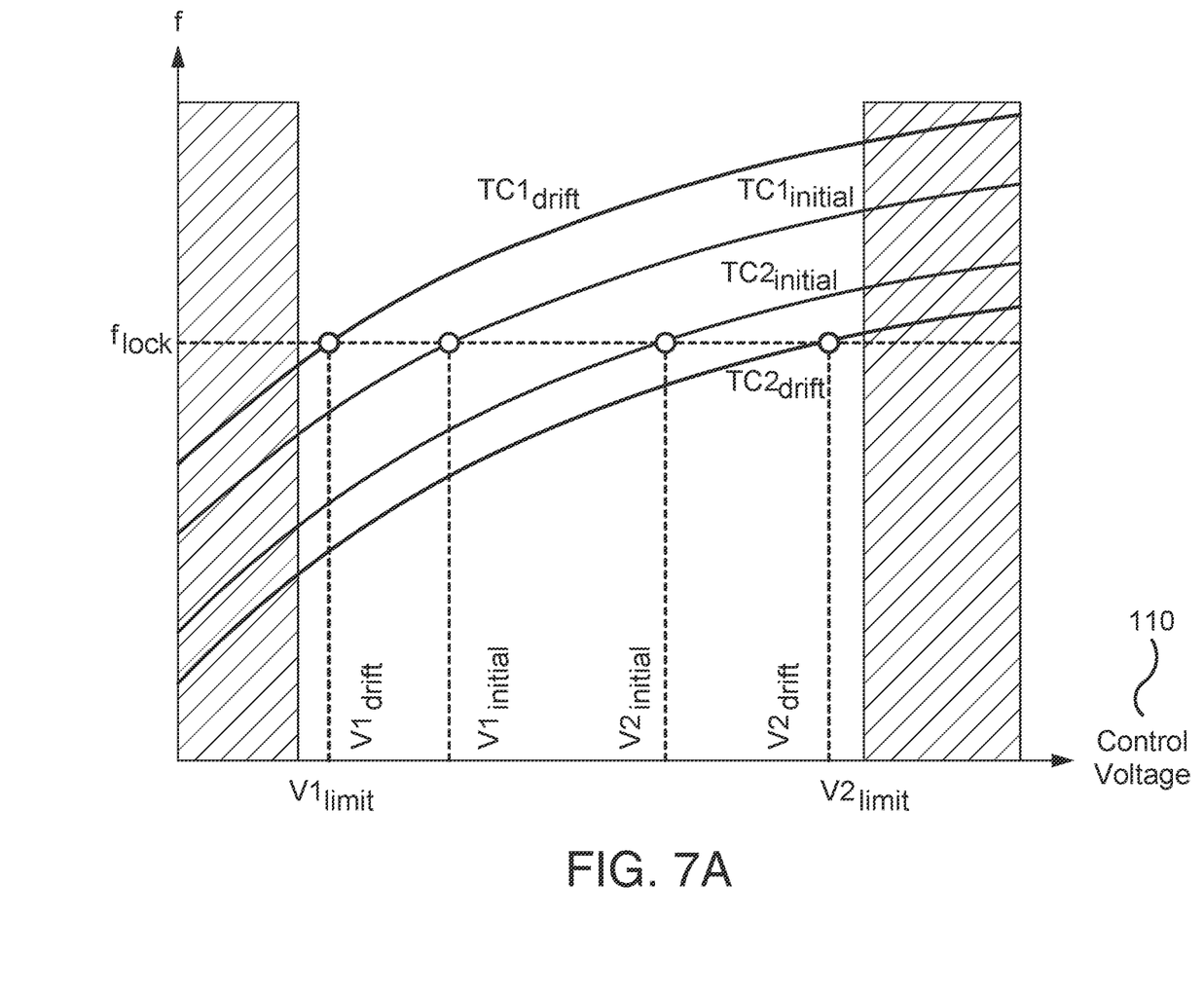
FIGS. 7A, 7B, and 7C illustrate example charts for the operation of the oscillator of the system of FIG. 1.
Figure 7B:
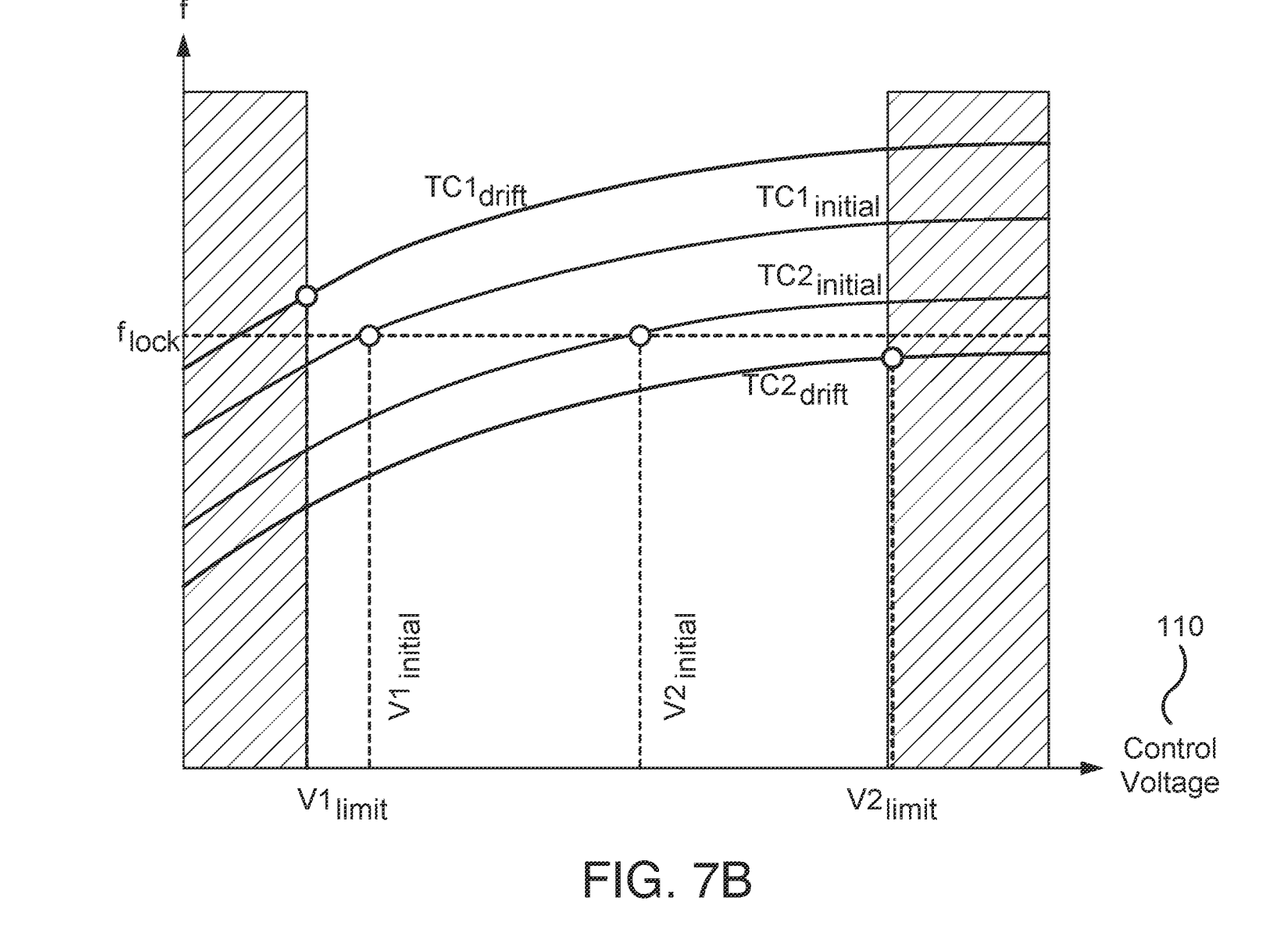
Figure 7C:
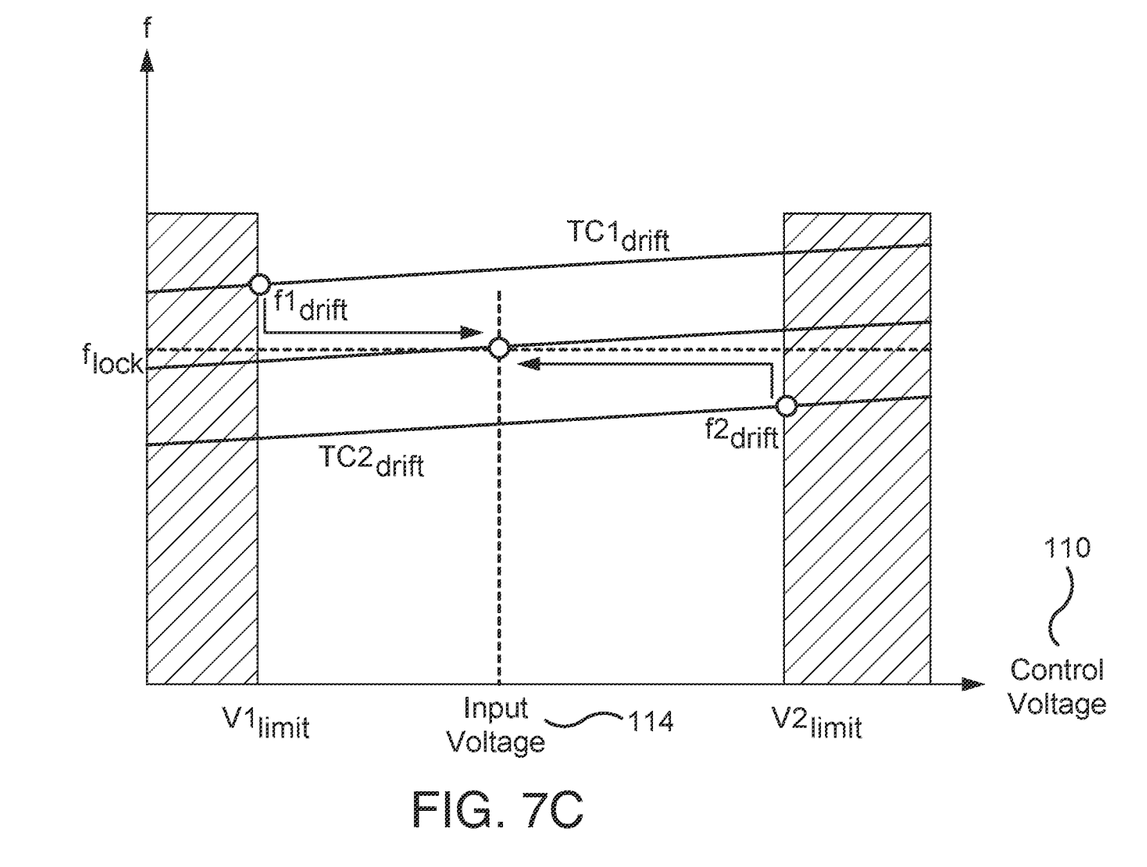

FIGS. 7A, 7B, and 7C illustrate example charts for the operation of the oscillator 106 of the system 100 of FIG. 1. FIG. 7A illustrates a normal operation of the oscillator 106. As seen in FIG. 7A, the control voltage 110 may be initially set at a voltage $V1_{initial}$ or a voltage $V2_{initial}$, which causes the tuning of the oscillator 106 to be on tuning curves $TC1_{initial}$ or $TC2_{initial}$, respectively. As a result of the tuning, the oscillator 106 outputs the output signal 112 with the lock frequency (flock).

Changes in operating condition may cause the tuning of the oscillator 106 to change or drift. In the example of FIG. 7A, $TC1_{initial}$ drifts to $TC1_{drift}$, and $TC2_{initial}$ drifts to $TC2_{drift}$. The control voltage 110 may drift from $V1_{initial}$ to $V1_{drift}$, or $V2_{initial}$ to $V2_{drift}$ to keep the frequency of the output signal 112 at the lock frequency. Notably, $V1_{drift}$ and $V2_{drift}$ fall within the voltage range supported by the oscillator 106. In the example of FIG. 7A, this voltage range is indicated by $V1_{limit}$ and $V2_{limit}$. As a result, the oscillator 106 is considered locked and continues producing the output signal 112 at the lock frequency.

FIG. 7B illustrates the operation of the oscillator 106 when the oscillator 106 is unlocked. As seen in FIG. 7B, the control voltage 110 begins at $V1_{initial}$ or $V2_{initial}$. The tuning of the oscillator 106 begins at tuning curves $TC1_{initial}$ and $TC2_{initial}$. As a result, the oscillator 106 produces the output signal 112 with the lock frequency.

Changes in operating conditions may cause the tuning of the oscillator 106 to change. For example, TC1 initial may drift to $TC1_{drift}$, and $TC2_{initial}$ may drift to $TC2_{drift}$. As seen in FIG. 7B, in order for the oscillator 106 to continue producing the output signal 112 with the lock frequency along $TC1_{drift}$ or $TC2_{drift}$, the control voltage 110 would need to drift beyond the voltage range supported by the oscillator 106 indicated by $V1_{limit}$ and $V2_{limit}$. Because the oscillator 106 cannot support control voltages 110 beyond $V1_{limit}$ or $V2_{limit}$, the oscillator 106 operates as if the control voltage 110 is at $V1_{limit}$ or $V2_{limit}$. As a result, the oscillator 106 produces the output signal 112 with a frequency that is above the lock frequency for $TC1_{drift}$ or below the lock frequency for $TC2_{drift}$. As a result, the oscillator 106 is considered unlocked.

FIG. 7C illustrates the example operation of the oscillator 106 with the added frequency control circuit 104. As seen in FIG. 7C, the oscillator 106 produces the output signal 112 with the frequency $f1_{drift}$ for $TC1_{drift}$ or the output signal 112 with the frequency $f2_{drift}$ for $TC2_{drift}$. As discussed previously, the voltage control circuit 102 may adjust the control voltage 110 to try to offset or counter the deviation from the lock frequency. As seen in FIG. 7C, to counter $f1_{drift}$ or $f2_{drift}$, the control voltage 110 would need to be decreased along $TC1_{drift}$ or increased along $TC2_{drift}$. However, the control voltage 110 would be well outside the voltage range supported by the oscillator 106 indicated by $V1_{limit}$ and $V2_{limit}$. As a result, the voltage control circuit 102 may not bring the frequency of the output signal 112 back to the lock frequency on its own.

The frequency control circuit 104 may detect that the control voltage 110 is not substantially equal to the input voltage 114. For example, the frequency control circuit 104 may detect that the control voltage 110 is at or below $V1_{limit}$, which is less than the input voltage 114. As another example, the frequency control circuit 104 may detect that the control voltage 110 is at or above $V2_{limit}$, which is greater than the input voltage 114. In response, the frequency control circuit 104 produces the control signal 116 that re-tunes the oscillator 106. For example, if the oscillator 106 is operating along $TC1_{drift}$, the frequency control circuit 104 may produce the control signal 116 that shifts $TC1_{drift}$ downwards. As a result, $f1_{drift}$ may begin decreasing. As another example, if the oscillator 106 is operating along $TC2_{drift}$, the frequency control circuit 104 may produce the control signal 116 that raises $TC2_{drift}$. As a result, $f2_{drift}$ may begin increasing.

The frequency control circuit 104 may produce the control signal 116 that causes the frequency of the output signal 112 to cross the lock frequency. For example, if the oscillator 106 is operating along $TC1_{drift}$, the frequency control circuit 104 may produce the control signal 116 that causes $f1_{drift}$ to reduce below the lock frequency. As another example, if the oscillator 106 is operating along $TC2_{drift}$, the frequency control circuit 104 may produce the control signal 116 that causes $f2_{drift}$ to increase above the lock frequency.

When the frequency of the output signal 112 crosses the lock frequency, the voltage control circuit 102 may begin changing the control voltage 110 to bring the control voltage 110 closer to the input voltage 114. For example, if $f1_{drift}$ reduces below the lock frequency, then the voltage control circuit 102 may begin increasing the control voltage 110, bringing the frequency of the output signal 112 closer to the lock frequency and bringing the control voltage 110 closer to the input voltage 114. As another example, if $f2_{drift}$ increases above the lock frequency, then the voltage control circuit 102 may begin decreasing the control voltage 110, bringing the frequency of the output signal 112 closer to the lock frequency and bringing the control voltage 110 closer to the input voltage 114.

The frequency control circuit 104 may continue re-tuning the oscillator 106 until the voltage control circuit 102 changes the control voltage 110 to be substantially equal to the input voltage 114 (e.g., within 10 millivolts). For example, the frequency control circuit 104 may continue shifting $TC1_{drift}$ downwards until the voltage control circuit 102 increases the control voltage 110 to the input voltage 114. As another example, the frequency control circuit 104 may continue shifting $TC2_{drift}$ upwards until the voltage control circuit 102 decreases the control voltage 110 to be substantially equal to the input voltage 114.

After the control voltage 110 reaches the input voltage 114, the system 100 may be in steady state operation. The frequency control circuit 104 may produce or change the control signal 116 to offset or counter subsequent drift in the frequency of the output signal 112 caused by changes in operating conditions. In this manner, the frequency control circuit 104 helps maintain the frequency of the output signal 112 while maintaining the control voltage 110 within the voltage range supported by the oscillator 106.

In summary, the system 100 (e.g., a clock synthesizer circuit) uses two types of control to produce an output signal 112 (e.g. an output clock signal). First, the system 100 uses a voltage control circuit 102 to control an oscillator 106 that produces the output signal 112. Due to the low gains in the oscillator 106 (e.g., to reduce power consumption), the oscillator 106 may unlock and cause the output signal 112 to have a frequency different from a desired lock frequency. The system 100 uses a frequency control circuit 104 to retune the oscillator 106 so that the frequency of the output signal 112 is brought back closer to the lock frequency. Additionally, the control voltage 110 produced by the voltage control circuit 102 is brought back towards a desired input voltage 114 within the voltage range supported by the oscillator 106.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A clock synthesizer comprising:
   an oscillator arranged to produce an output signal with a frequency;
   a voltage control circuit arranged to produce a control voltage for the oscillator based on the frequency of the output signal; and
   a frequency control circuit arranged to produce a control signal for the oscillator based on (i) an input voltage to the frequency control circuit and (ii) the control voltage, wherein the control signal causes the oscillator to adjust the frequency of the output signal such that the voltage control circuit adjusts the control voltage to be closer to the input voltage.

2. The clock synthesizer of claim 1, wherein the oscillator comprises a first set of voltage controlled capacitors and a second set of voltage controlled capacitors.

3. The clock synthesizer of claim 2, wherein a capacitance of the first set of voltage controlled capacitors varies based on the control voltage.

4. The clock synthesizer of claim 2, wherein a capacitance of the second set of voltage controlled capacitors varies based on the control signal.

5. The clock synthesizer of claim 1, wherein the frequency control circuit comprises a comparator arranged to produce a comparator output based on the control voltage and the input voltage.

6. The clock synthesizer of claim 5, wherein the frequency control circuit further comprises a filter arranged to produce the control signal based on the comparator output.

7. The clock synthesizer of claim 6, wherein the filter comprises an integrator arranged to integrate the comparator output and a scaling factor.

8. The clock synthesizer of claim 7, wherein the filter further comprises a modulator arranged to produce an offset for an output of the integrator.

9. The clock synthesizer of claim 8, wherein the filter further comprises an encoder arranged to convert the offset and the output of the integrator from binary to thermometer code to produce the control signal.

10. The clock synthesizer of claim 1, wherein the input voltage is half of a supply voltage to the voltage control circuit.

11. A method for producing an alternating signal, the method comprising:
    producing, by an oscillator, an output signal with a frequency;
    producing, by a voltage control circuit, a control voltage for the oscillator based on the frequency of the output signal;
    producing, by a frequency control circuit, a control signal for the oscillator based on (i) an input voltage to the frequency control circuit and (ii) the control voltage;
    adjusting, by the oscillator and based on the control signal, the frequency of the output signal; and
    adjusting, by the voltage control circuit, the control voltage to be closer to the input voltage after the oscillator adjusts the frequency of the output signal.

12. The method of claim 11, wherein the oscillator comprises a first set of voltage controlled capacitors and a second set of voltage controlled capacitors.

13. The method of claim 12, wherein a capacitance of the first set of voltage controlled capacitors varies based on the control voltage.

14. The method of claim 12, wherein a capacitance of the second set of voltage controlled capacitors varies based on the control signal.

15. The method of claim 11, further comprising producing, by a comparator of the frequency control circuit, a comparator output based on the control voltage and the input voltage.

16. The method of claim 15, wherein the frequency control circuit further comprises a filter arranged to produce the control signal based on the comparator output.

17. The method of claim 16, further comprising integrating, by an integrator of the filter, the comparator output and a scaling factor.

18. The method of claim 17, further comprising producing, by a modulator of the filter, an offset for an output of the integrator.

19. The method of claim 18, wherein the filter further comprises an encoder arranged to convert the offset and the output of the integrator from binary to thermometer code to produce the control signal.

20. A circuit for producing an alternating signal, the circuit comprising:
    a voltage control circuit arranged to produce a control voltage;
    a frequency control circuit arranged to produce a control signal; and an oscillator arranged to produce an output signal with a frequency based on the control voltage and the control signal, wherein the frequency control circuit is further arranged to adjust the control signal such that the voltage control circuit adjusts the control voltage to be closer to an input voltage to the frequency control circuit.

* * * * *